United States Patent [19]

Lamerichs et al.

[11] Patent Number: 5,283,525
[45] Date of Patent: Feb. 1, 1994

[54] METHOD AND DEVICE FOR THE VOLUME-SELECTIVE EXTRACTION OF A MAGNETIC RESONANCE SPECTRUM BY HARTMANN-HAHN TRANSFER

[75] Inventors: Rudolf M. J. N. Lamerichs; Reurt P. Van Stapele; Jan A. Den Hollander, all of Eindhoven, Netherlands

[73] Assignee: U.S. Philips Corporation, New York, N.Y.

[21] Appl. No.: 871,947

[22] Filed: Apr. 22, 1992

[30] Foreign Application Priority Data

May 23, 1991 [EP] European Pat. Off. ........ 91201228.3

[51] Int. Cl.$^5$ .............................................. G01V 3/00
[52] U.S. Cl. .................................. 324/307; 324/309
[58] Field of Search ............... 324/300, 307, 309, 313, 324/314

[56] References Cited

U.S. PATENT DOCUMENTS

| | | | |
|---|---|---|---|
| 4,682,107 | 7/1987 | Bendall et al. | 324/307 |
| 4,922,203 | 5/1990 | Sillerud et al. | 324/307 |
| 4,987,369 | 1/1991 | Van Stapele et al. | 324/307 |

FOREIGN PATENT DOCUMENTS 0347990  6/1988  European Pat. Off. .

OTHER PUBLICATIONS

R. R. Ernst et al., "Principles of Nuclear Magnetic Resonance in One and Two Dimensions", Oxford Scientific Publications, 1986, pp. 185-191.

R. J. Ordidge et al., "Image-Selected in Viro Spectroscopy (ISIS). A New Technique for Spatially Selective NMR Spectroscopy", Journal of Magnetic Resonance, vol. 66, pp. 283-194. (Apr. 1985).

*Primary Examiner*—Louis Arana
*Attorney, Agent, or Firm*—Jack D. Slobod

[57] ABSTRACT

An object is placed within the field of magnetic coils which generate a steady uniform magnetic field. The object contains nuclear spins of coupled first and second types of nucleus, for example, $CH_n$ in which C is a $^{13}C$ carbon isotope and H is a $^1H$ proton. Magnetic resonance signals are generated in the object by RF pulses. Pulse and gradient sequences are generated for providing magnetization transfer from the first nucleus to the second nucleus via first and second channels. A display displays spectra formed from resonance signals processed by a programmed processor via Fourier tranformation of sampled values. A pick up coil is tuned to receive the signals from a corresponding nucleus which is processed by a corresponding channel. The process is volume selective combined with a Hartmann-Hahn transfer sequence.

18 Claims, 3 Drawing Sheets

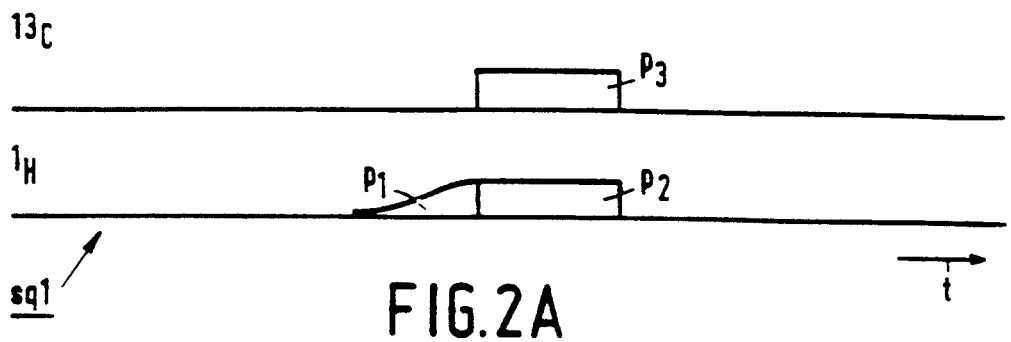
FIG.2A
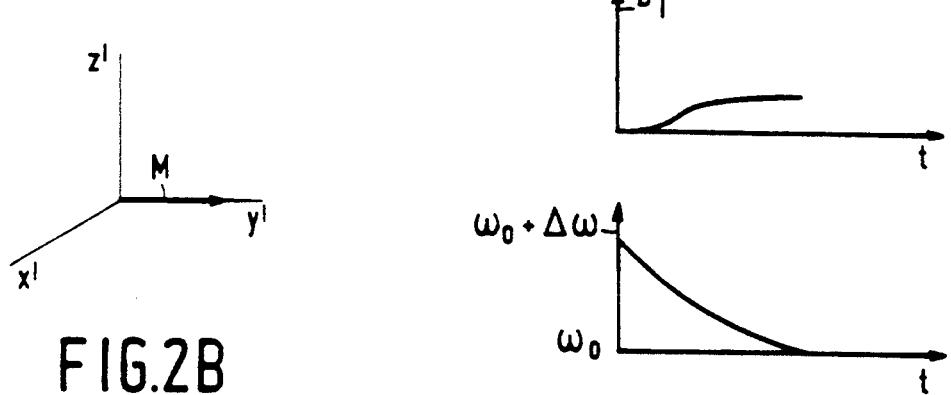
FIG.2B
FIG.2C
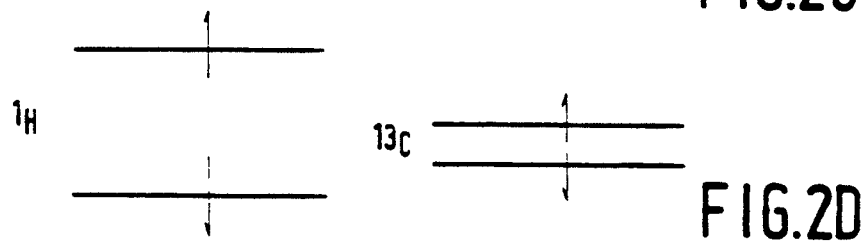
FIG.2D
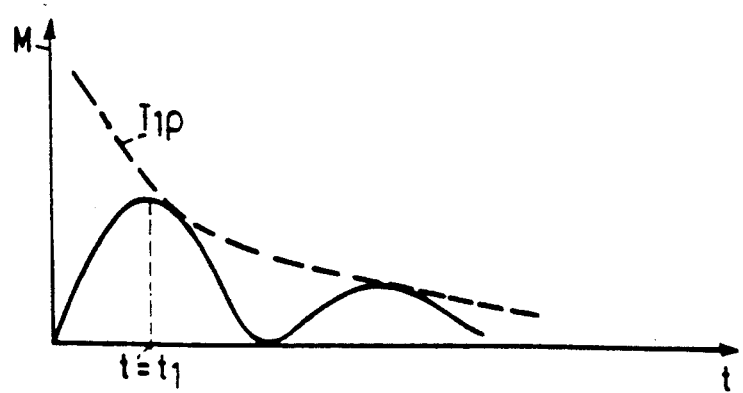
FIG.2E

METHOD AND DEVICE FOR THE VOLUME-SELECTIVE EXTRACTION OF A MAGNETIC RESONANCE SPECTRUM BY HARTMANN-HAHN TRANSFER

BACKGROUND OF THE INVENTION

1. Field of the Invention

The invention relates to a magnetic resonance method for the volume-selective extraction of spectral information from an object containing a first type of nucleus and a second type of nucleus which is coupled to the first type of nucleus, the object being arranged in a steady, uniform magnetic field, the spectral information being extracted from magnetization transfer from one of the first and second types of nuclei to the other.

The invention also relates to a magnetic resonance imaging device for the volume-selective extraction of spectral information from an object containing a first type of nucleus and a second type of nucleus which is coupled to the first type of nucleus, which device comprises means for generating a steady, uniform magnetic field, transmitter means for transmitting RF electromagnetic pulses to the object arranged in the steady field, means for generating magnetic field gradients superposed on the steady field, and receiving and processing means for the magnetic resonance signals generated in the object, which processing means include programmed means and are operative to apply, by way of the transmitter means, pulses to the first and the second type of nucleus so that the spectral information is extracted from magnetization transfer.

2. Description of the Prior Art

A magnetic resonance imaging method and device of this kind are known from European Patent Application No. 0 347 990 which corresponds to U.S. Pat. No. 4,987,369. The cited Application describes a volume-selective polarization transfer sequence in which volume selection of a part of the object coincides with a polarization transfer sequence, three pulses of which are applied to a first type of nucleus via a first channel, while two pulses thereof, being at least partly coincident with the three pulses, are applied to a second type of nucleus via a second channel. The nuclei are, for example proton-coupled carbon atoms such as in a $CH_n$ system. Volume selection is achieved by application of slice-selective magnetic field gradients during application of the pulses.

Even though such a known method offers an improvement over, for example so-called DEPT sequences (Distortionless Enhancement by Polarization Transfer) preceded by volume selection such as VSE (Volume Selective Excitation), the known sequence still has drawbacks. This is because the transfer efficiency is highly dependent on correct adjustment of the excitation angle of the pulses to protons as well as $^{13}C$ in, for example a $CH_n$ system. Accurate timing of the pulses is also a critical factor. For such sequences use is often made of a double surface coil having different RF profiles, so-called $B_1$ profiles, for the proton fields and the $^{13}C$ fields. The latter makes adjustment additionally difficult in practice. For in vivo measurements the efficiency of the magnetization transfer may be further affected by excitation angle variations due to local $B_1$ inhomogeneities.

SUMMARY OF THE INVENTION

It is an object of the invention to provide a method and device which do not have such drawbacks.

A method in accordance with the invention is characterized in that the magnetization transfer is realized by heteronuclear Hartmann-Hahn transfer, the spectral information of at least one type of nucleus being extracted from transferred magnetization of the other type of nucleus. In such a volume-selective Hartmann-Hahn sequence localized transverse magnetization is spin-locked to, for example to the protons and during spin-locking to the other type of nucleus, for example proton-coupled $^{13}C$, an RF electromagnetic field is applied. So-called Hartmann-Hahn transfer or cross-polarization transfer is achieved when the so-called Hartmann-Hahn condition is satisfied:

$$\gamma'.B_1' = \gamma''.B_1''$$

where $\gamma'$ and $\gamma''$ are the gyromagnetic ratios of the first and the second type of nucleus, respectively, and $B_1'$ and $B_1''$ are the RF electromagnetic fields on the first and the second type of nucleus, respectively. The sequence in accordance with the invention requires a much simpler adjustment, because only the ratio of the respective RF electromagnetic fields need be adjusted. As a result, the significance of local inhomogeneities in the RF electromagnetic fields, as occurring during in vivo measurements, is far less than in the known method.

It is to be noted that Hartmann-Hahn transfer is described per se in the book "Principles of Nuclear Magnetic Resonance in One and Two Dimensions", R. R. Ernst e.a., Oxford Scientific Publications, 1986, pp. 185-191. Except that the cited book states that the Hartmann-Hahn experiment per se imposes severe requirements as regards devices to be used for executing the experiment, it is also noted that other transfer methods are to be preferred for liquids.

A version of a method in accordance with the invention is characterized in that the heteronuclear Hartmann-Hahn transfer is realized by applying an adiabatic RF electromagnetic pulse to the first type of nucleus in order to bring a magnetization of the object out of a state of equilibrium and by subsequently spin-locking the magnetization brought out of the state of equilibrium by means of an RF electromagnetic spin-lock pulse while at the same time applying a cross-polarization transfer pulse to the second type of nucleus. Notably when use is made of surface coils, exhibiting a non-uniform sensitivity pattern, this version offers major advantages because the excitation angle over the sensitivity range of the coil is then independent from the non-uniform sensitivity pattern of the coil within given limits. It is also to be noted that in the case of known sequences, such as DEPT, the magnetization transfer mechanism is very susceptible to variations as regards excitation angle of the nuclear spins; this is not the case in the method in accordance with the invention.

A further version of a method in accordance with the invention is characterized in that the volume selection is realized by surface coils. The Hartmann-Hahn condition will be satisfied only in a limited region. The location of the localized region can be varied by variation of the field strength. This version can be of importance notably for the measurement of metabolites having a comparatively short $T_1$ or $T_2$ relaxation time.

Such a volume selection per se is described in U.S. Pat. No. 4,682,107.

Another version of a method in accordance with the invention is characterized in that the Hartmann-Hahn transfer is realized by applying a volume-selective pulse and gradient sequence to the first type of nucleus in order to bring a magnetization of the object volume-selectively out of a state of equilibrium and by subsequently spin-locking the magnetization volume-selectively brought out of the state of equilibrium by means of an RF electromagnetic spin-lock pulse while at the same time applying a cross-polarization transfer pulse to the second type of nucleus. The localization is thus improved in comparison with the use of surface coils for localization. Volume selection can be realized, for example by a PRESS, ISIS or STEAM sequence, the spin-lock field being applied at the instant of echo formation.

Another version of a method in accordance with the invention is characterized in that the volume-selective pulse and gradient sequence is a localized spin-echo sequence and in that a phase encoding gradient is applied after the cross-polarization transfer pulse and before signal acquisition. Via the localized spin-echo sequence, a bar is then selected as the part of the object and at the instant of echo-formation a spin-lock field is applied. The bar is sub-divided by the phase encoding and, after Fourier transformation, a set of spectra is obtained from the bar. The bar can be chosen so as to extend through a heart of an in vivo animal or human object.

Another version of a method in accordance with the invention is characterized in that a single double-tuned coil is used for applying pulses to the respective nuclei. Because the $B_1$ profiles of both fields are then identical, Hartmann-Hahn transfer can be achieved over a comparatively large volume.

A further version of a method in accordance with the invention is characterized in that the first type of nucleus is a proton, the second type of nucleus being a carbon isotope enriched in the object, signal acquisition of magnetization transferred to protons by enriched carbon isotopes then taking place. The sequence in accordance with the invention will generally be used in conjunction with the use of transfer from an abundantly present nucleus such as a proton nucleus, to a nucleus which occurs only rarely, utilizing a "gain" factor which is given by the ratio of the gyromagnetic ratios of the nuclei. In the present example the same transfer mechanism is used, but measurement takes place via the channel other than the customary channel, i.e. via the proton channel in the present example. However, the nucleus which inherently occurs to a lesser extent in vivo should then be enriched, for example by injection or oral administration in order to achieve adequate signal strength. For example, when the non-toxic glucose is applied in vivo as an enrichment of a $^{13}C$ isotope, the metabolism thereof, notably in the brain of the object, can be traced. The latter offers major advantages with respect to so-called PET (Positron Emission Tomography) techniques where radioactive compounds are injected into the object, for example radioactive modified glucose compounds.

BRIEF DESCRIPTION OF THE DRAWING

The invention will be described in detail hereinafter with reference to a drawing; therein:

FIGS. 2A to 2E show a first version of a pulse and gradient sequence in accordance with the invention as well as its effects.

DESCRIPTION OF THE PREFERRED EMBODIMENT

Figure 1:
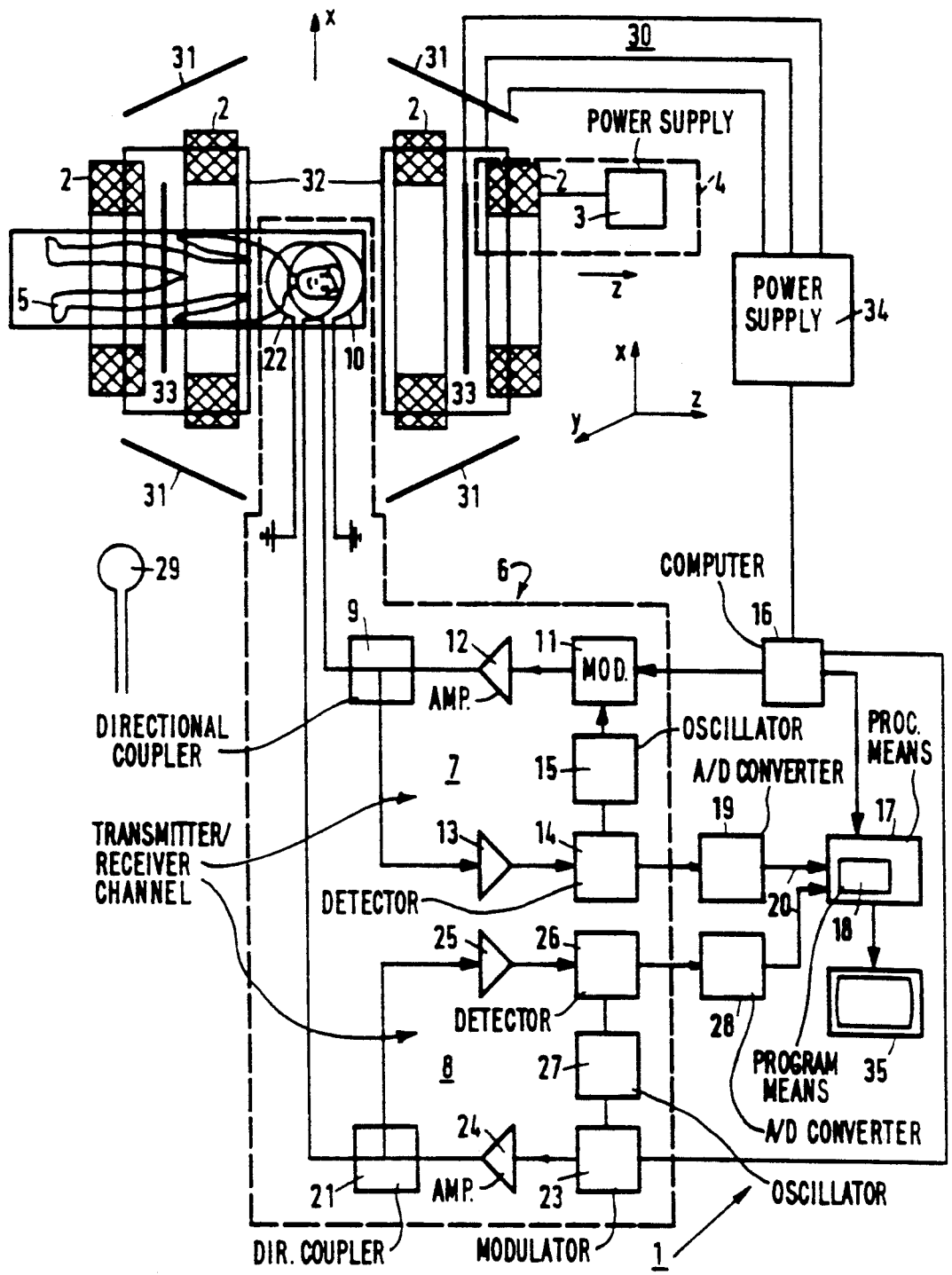
FIG. 1 shows diagrammatically a magnetic resonance device in accordance with the invention.

FIG. 1 shows diagrammatically a device 1 in accordance with the invention. The device 1 comprises magnet coils 2 and, in the case of resistive magnets or superconducting magnets, a DC power supply 3. The magnet coils 2 and the DC power supply 3 constitute means for generating a steady, uniform magnetic field. When the magnet coils 2 are constructed as permanent (superconducting) magnets, the DC power supply 3 will be absent. An object 5 can be arranged within the magnet coils 2. The object 5 may contain nuclear spins of a first type of nucleus and of a second type of nucleus which may be coupled to one another, for example in a $CH_n$ group of a molecule in which C is a $^{13}C$ carbon isotope and H is a $^1H$ proton. Other types of nuclei are also feasible. The coupling can then be expressed by a coupling constant $J_{CH}sec^{-1}$. During operation of the device 1 with the object 5, which may be an in vivo human or animal object, being arranged within the magnet coils 2, a slight excess of nuclear spins (of nuclei having a magnetic moment) will be directed in the direction of the steady field in a state of equilibrium. From a macroscopic point of view this is to be considered as an equilibrium magnetization. The device 1 furthermore comprises means 6 for generating magnetic resonance signals in the body by RF electromagnetic pulses. The means 6 comprise a first transmitter/receiver channel 7 and a second transmitter/receiver channel 8. The first transmitter/receiver channel 7 is coupled, via a directional coupler 9, to a first coil 10 for the transmission of RF electromagnetic pulses and for the reception of magnetic resonance signals. The first transmitter/receiver channel comprises a modulator 11, an amplifier 12, an amplifier 13, a phase-sensitive detector 14 and an oscillator 15 for generating a carrier signal. The modulator 11 may be an amplitude and/or frequency and/or phase modulator and is controlled by a process computer or programmed control means 16 which is coupled to processing means 17 which include programmed means 18. A magnetic resonance signal received via the first transmitter/receiver channel 7 is demodulated in the phase-sensitive detector 14 and the demodulated signal is applied to an A/D converter 19. Sampling values 20 can be applied to the processing means 17. The construction of the second transmitter/receiver channel 8 is identical and comprises a directional coupler 21, a transmitter/receiver coil 22, a modulator 23, an amplifier 24, an amplifier 25, a phase-sensitive detector 26, and an oscillator 27. The phase-sensitive detector 26 is coupled to an A/D converter 28 which itself is coupled to the processing means 17. When the device 1 is used to generate pulse and gradient sequences for realizing magnetization transfer from a first type of nucleus to a second type of nucleus coupled to the first type of nucleus, the oscillator 15 will be adjusted to the spin resonance of the first type of nucleus and the oscillator 27 will be adjusted to the spin resonance of the second type of nucleus. The coils 10 and 22 can be replaced by a surface coil 29 which may be a single double-tuned coil tuned to the respective resonant frequencies of the respective nuclei. In the latter case this coil is connected to the directional couplers 9 and 21 via a customary frequency separation filter for separating the respective resonant frequencies of the two types of nuclei. The coils 10 and 22 may alternatively be formed by a double concentrically arranged coil which thus enables volume selection. When use is made of surface coils, such coils will be displaceable within the device 1. The device 1 also comprises means 30 for generating magnetic field gradients superposed on the steady field. The means 30 comprise gradient magnet coils 31 for generating a magnetic field gradient $G_x$, gradient magnet coils 32 for generating a magnetic field gradient $G_y$, gradient magnet coils 33 for generating a magnetic field gradient $G_z$, and a power supply 34 which is controlled by the process computer 16 and which serves to power the gradient magnet coils 31, 32 and 33 which are individually activatable. In the embodiment shown the gradient magnet coils 31, 32 and 33 are arranged in space so that the field direction of the magnetic field gradients $G_x$, $G_y$ and $G_z$ coincides with the direction of the steady field and that the gradient directions extend perpendicular to one another as denoted by three mutually perpendicular axes x, y and z in FIG. 1. The device 1 furthermore comprises display means for displaying spectra to be formed from resonance signals received. The programmed means 18 are operative to determine, for example by way of a Fourier transformation, spectra from the sampling values 20, for example obtained via the second transmitter/receiver channel 8.

FIG. 2A shows a first version of a pulse and gradient sequence sq1 in accordance with the invention as a function of time t, volume selection being realized by the coils 10 and 22 which are constructed as surface coils. By way of example it will be assumed that the first type of nucleus is a bound proton $^1H$, coupled to a $^{13}C$ carbon isotope. The coils 10 and 22 may be concentric coils, the coil 10 being coupled to the transmitter/receiver channel 7 and being tuned to $^1H$, while the coil 22 is coupled to the transmitter/receiver channel 8 and tuned to $^{13}C$. In accordance with the invention, via the channel 7, being the proton channel, an adiabatic pulse $p_1$ is applied which, in the case of a so-called 90° adiabatic pulse, brings an equilibrium proton magnetization volume-selectively into a transverse state. This is shown in FIG. 2B in a rotating proton coordinate system x', y' and z' with the magnetization M. In the case of an adiabatic pulse, the modulator 11 in the proton channel is an ampitude/frequency modulator. FIG. 2C shows the variation of the RF field $B_1$ in the case of an adiabatic pulse as a function of time t with simultaneous variation of the frequency, varying from $\omega_0+\Delta\omega$ to $\omega_0$, i.e. with a frequency swing $\Delta\omega$ about the proton resonant frequency $\omega_0$. Subsequently, via the proton channel 7 a spin-lock pulse $p_2$ is applied to the object 5 under the control of the programmed means 18. The $B_1$ field of the spin-lock pulse $p_2$ should then be directed along the same axis as the magnetization M. During the spin-lock pulse $p_2$ a cross-polarization transfer pulse $p_3$ is applied to the object 5 via the $^{13}C$ channel 8. After termination of the pulses $p_2$ and $p_3$, a resonance signal 20 is sampled in the proton channel 7 and processed in the processing means 17, using Fourier transformation, so as to obtain a spectrum. Due to the transfer a carbon magnetization is observed which has been intensified by the ratio of the gyromagnetic ratios of protons and the carbon isotope coupled thereto, i.e. by a "gain" factor 4. In this respect it is important that the so-called Hartmann-Hahn condition is satisfied, i.e. in the present example the $B_1$ fields should relate as 1:4.

FIG. 2D shows Zeeman splitting of energy levels in the steady field for $^1H$ and $^{13}C$, spin-up and spin-down also being diagrammatically shown therein. The Hartmann-Hahn transfer condition implies that the energy gradients should correspond, i.e. the spin-locked system can transfer energy only subject to the Hartmann-Hahn condition. In that case the transfer is "smooth", in this respect it is to be noted that a perturbance term should be present in liquid. In the relevant example this perturbance term is present in the form of a J-coupling between $^1H$ and $^{13}C$, the speed of transfer being proportional to this coupling constant, i.e. the time required for the cross-polarization transfer is inversely proportional to the J-coupling. Proton-carbon couplings are comparatively great (125-170 Hz), so that cross-polarization transfer times of from 4 to 7 ms suffice.

FIG. 2E shows the behavior of transferred transverse magnetization M as a function of time t. It appears that the transfer is an oscillatory reciprocal process. The magnetization transferred can be sampled at the first maximum at the instant $t=t_1=1/J$. In an absolute sense the magnetization decreases due to relaxation which is inherently present; in the present example this is the relaxation of fat in a rotating system of coordinates, $T_{1\rho}$, amounting to about 300 ms. For example, when a glycogen coupling is considered, the relaxation in the rotating system of coordinates is about two orders of magnitude smaller than that of fat. In that case signal acquisition should take place prior to the first magnetization peak, as shown in FIG. 2E, in order to obtain an optimum result. In a human object 5 glycogen occurs notably in muscular tissue and the liver and can provide an indication as regards the energy conditions in the object. A deviating glycogen concentration will be found in the case of metabolic disorders.

Figure 3:
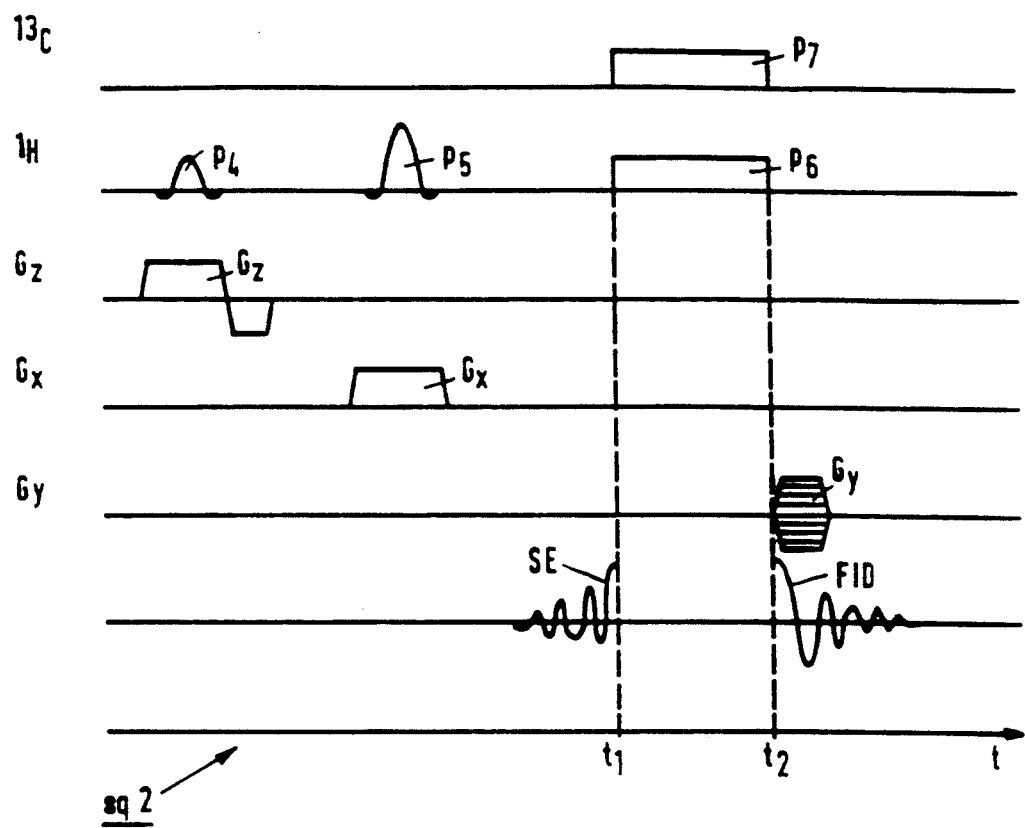
FIG. 3 shows a second version of a pulse and gradient sequence in accordance with the invention.

FIG. 3 shows a second version of a pulse and gradient sequence sq2 in accordance with the invention as a function of time t. Via the first channel 7, for example the proton channel $^1H$, a localized spin-echo sequence is applied which comprises a localized excitation pulse $p_4$ having a gradient $G_z$ and also a localized inversion pulse $p_5$ having a gradient $G_x$. At the instant $t=t_1$, at the maximum of the spin-echo signal SE, a spin-lock pulse $p_6$ is applied to the object 5, a cross-polarization transfer pulse $p_7$ being applied at the same time via the channel 8, for example the $^{13}C$ channel. As a result, a transferred resonance signal FID localized in a bar is obtained. By application of a phase encoding gradient $G_y$ immediately after termination of the spin-lock, resonance signals are obtained from parts of the bar, it being possible to reconstruct spectra therefrom by means of the programmed means 18.

In other versions, a volume-selective pulse and gradient sequence such as PRESS, ISIS or STEAM is first applied to the first type of nucleus, thus bringing the magnetization volume-selectively out of equilibrium. Subsequently, Hartmann-Hahn transfer to the second type of nucleus takes place. In the case of a PRESS sequence as described in European Patent Application No. 0 106 226 and a STEAM sequence as described in U.S. Pat. No. 4,748,409, spin-locking is applied at the maximum of the volume-selective echo resonance signal or the stimulated spin-echo signal, respectively. The excitation pulses are then spatially selective and no magnetic gradient is applied during the occurrence of the volume-selective resonance signal. In the case of the ISIS sequence as described in Journal of Magnetic Resonance 66, 283–294 (1986), volume-selective magnetization is obtained by 8-fold application of pulse and gradient combinations. The ISIS excitation pulse is then preferably an adiabatic 90° pulse and spin-locking is applied during occurrence of a FID signal due to the ISIS excitation pulse.

Because of the reciprocal nature of the Hartmann-Hahn transfer, measurement is also possible via the channel which is not the customary channel. In the case of proton-carbon coupling, however, it is then necessary to enrich the carbon in practice, for example by injection or oral administration of glucose to an object whose metabolism can then be traced. Additional phase encoding gradients can then also be applied in order to obtain magnetic resonance signals for a spectroscopic image, for example after the spin-lock pulses and before signal acquisition. The latter method could be an alternative to PET (Positron Emission Tomography) which utilizes radioactive compounds.

We claim:

1. A magnetic resonance method for the volume-selective extraction of spectral information from an object under examination containing a first type of nucleus and a second type of nucleus which is coupled to the first type of nucleus, said object being arranged in a steady uniform magnetic field, said method comprising: performing heteronuclear Hartmann-Hahn magnetization transfer, and extracting spectral information of at least one of the first and second types of nucleus from transferred magnetization of the other of the first and second types of nucleus, at least one of said performing the Hartmann-Hahn transfer and said extracting spectral information being substantially only with respect to a selected volume of the object.

2. A magnetic resonance method as claimed in claim 1, wherein the heteronuclear Hartmann-Hahn transfer is performed by applying an adiabatic RF electromagnetic pulse to the first type of nucleus in order to bring a magnetization of the object out of a state of equilibrium and by subsequently spin-locking the magnetization brought out of a state of equilibrium by means of an RF electromagnetic spin-lock pulse while at the same time applying a cross-polarization transfer pulse to the second type of nucleus.

3. A magnetic resonance method as claimed in claim 2 wherein a first type of nucleus is a proton, the second type of nucleus being a carbon isotope enriched in the object, and causing signal acquisition of magnetization transferred to protons by enriched carbon isotopes.

4. A magnetic resonance method as claimed in claim 2 wherein the first type of nucleus is a proton and causing signal acquisition of magnetization transferred by protons to the second type of nucleus.

5. A magnetic resonance method as claimed in claim 4 wherein the second type of nucleus is a carbon isotope enriched in the object, and causing signal acquisition of magnetization transferred to protons by enriched carbon isotopes.

6. A magnetic resonance method as claimed in claim 1, including providing volume selection with surface coils.

7. A magnetic resonance method as claimed in claim 1, wherein said performing the Hartmann-Hahn transfer includes applying a volume-selective pulse and gradient sequence to the first type of nucleus in order to bring a magnetization of the object volume-selectively out of a state of equilibrium and subsequently spin-locking the magnetization volume-selectively brought out of the state of equilibrium by an RF electromagnetic spin-lock pulse while at the same time applying a cross-polarization transfer pulse to the second type of nucleus.

8. A magnetic resonance method as claimed in claim 7 wherein the second type of nucleus is a carbon isotope enriched in the object, and causing signal acquisition of magnetization transferred to protons by enriched carbon isotopes.

9. A magnetic resonance method as claimed in claim 7 wherein the first type of nucleus is a proton and causing signal acquisition of magnetization transferred by protons to the second type of nucleus.

10. A magnetic resonance method as claimed in claim 9 wherein the second type of nucleus is a carbon isotope enriched in the object, and causing signal acquisition of magnetization transferred to protons by enriched carbon isotopes.

11. A magnetic resonance method as claimed in claim 7 wherein said applying the volume-selective pulse and gradient sequence includes applying one of a PRESS sequence, an ISIS sequences or STEAM sequence.

12. A magnetic resonance method as claimed in claim 7 including providing the volume-selective pulse and gradient sequence as a localized spin-echo sequence, and applying a phase encoding gradient after the cross-polarization transfer pulse and before signal acquisition.

13. A magnetic resonance method as claimed in claim 7, including using a single double-tuned coil for applying pulses to the respective nuclei.

14. A magnetic resonance method as claimed in claim 1 wherein the first type of nucleus is a proton and causing signal acquisition of magnetization transferred by protons to the second type of nucleus.

15. A magnetic resonance method as claimed in claim 14 wherein the second type of nucleus is a carbon isotope enriched in the object, and causing signal acquisition of magnetization transferred to protons by enriched carbon isotopes.

16. A magnetic resonance method as claimed in claim 1 wherein the first type of nucleus is a proton, the second type of nucleus being a carbon isotope enriched in the object, and causing signal acquisition of magnetization transferred to protons by enriched carbon isotopes.

17. A magnetic resonance method as claimed in claim 16 including enriching the carbon isotope by one of injection and oral administration of glucose.

18. A magnetic resonance device for the volume-selective extraction of spectral information from an object under examination containing a first type of nucleus and a second type of nucleus which is coupled to the first type of nucleus, said device comprising: means for generating a steady, uniform magnetic field in which said object is arranged, transmitter means for transmitting RF electromagnetic pulses to said object, means for generating magnetic field gradients superposed on the steady field, and receiving and processing means for receiving and processing magnetic resonance signals generated in the object, programmed control means operative to apply, by way of the transmitter means, RF pulses to the first and the second type of nucleus, said programmed control means being operative to cause the performance of Hartmann-Hahn magnetization transfer between the first and second types of nuclei and the extraction, by way of the receiving and processing means, of spectral information of at least one of said first and second types of nucleus from transferred magnetization of the other of the first and second types of nucleus, at least one of the performance of Hartmann-Hahn transfer and the extraction of spectral information being substantially only with respect to a selected volume of the object.

* * * * *